United States Patent [19]

Masuda et al.

[11] 4,158,211
[45] Jun. 12, 1979

[54] AUTOMATIC FREQUENCY CONTROL APPARATUS FOR TELEVISION RECEIVER

[75] Inventors: Mitsuya Masuda; Keisuke Yamamoto; Namio Yamaguchi, all of Ibaraki, Japan

[73] Assignee: Matsushita Electric Industrial Co., Ltd., Osaka, Japan

[21] Appl. No.: 874,532

[22] Filed: Feb. 2, 1978

[30] Foreign Application Priority Data

Feb. 3, 1977 [JP] Japan .................................. 52/11374

[51] Int. Cl.² .......................... H04N 5/50; H03B 3/04
[52] U.S. Cl. .................................... 358/195; 331/32
[58] Field of Search ................................ 358/21, 195; 325/416–423; 331/1 R, 17, 18, 30, 32

[56] References Cited

U.S. PATENT DOCUMENTS

| 3,842,198 | 10/1974 | Martin | 358/195 X |
| 3,940,554 | 2/1976 | Masuda | 358/195 |
| 4,091,421 | 5/1978 | Long | 358/195 |

*Primary Examiner*—Richard Murray
*Assistant Examiner*—Aristotelis M. Psitos
*Attorney, Agent, or Firm*—Stevens, Davis, Miller & Mosher

[57] ABSTRACT

An automatic local oscillation frequency control apparatus for a television receiver is disclosed, wherein a video intermediate frequency (VIF) signal is applied to an FM discriminator for generating an AFC voltage through a phase shifter comprised of a serial-parallel resonance circuit, and one of the serial resonance frequency and the parallel resonance frequency of the serial-parallel resonance circuit is selected to be a frequency near a picture carrier frequency while the other is selected to be a frequency which is made by subtracting one half of a differential frequency between the picture carrier frequency and a sound carrier frequency from the picture carrier frequency. The present apparatus can attain an automatic frequency control having a wide pull-in range and a wide hold range.

2 Claims, 8 Drawing Figures

AUTOMATIC FREQUENCY CONTROL APPARATUS FOR TELEVISION RECEIVER

The present invention relates to an automatic frequency control (AFC) apparatus for a television receiver for maintaining the frequency of a video intermediate frequency (VIF) signal at a constant frequency.

Heretofore, in a television receiver in which a received television signal is mixed with a local oscillation signal generated by a local oscillator circuit to produce a VIF signal, and AFC apparatus has been broadly used which discriminates the frequency of the VIF signal to apply an AFC control voltage of an S-characteristic to the local oscillator circuit when the frequency of the VIF signal shifts from a predetermined frequency to change the local oscillation frequency whereby the frequency of the VIF signal is always maintained at a selected frequency.

However, the prior art AFC apparatus has a disadvantage in that it has a narrow pull-in range and hold range.

It is, therefore, an object of the present invention to provide an AFC apparatus for a television receiver which has a wide pull-in range and hold range.

Another object of the present invention is to provide an apparatus which enables attainment of the above object with a very simple circuit configuration.

The above and other objects, features and advantages of the present invention will be apparent from the following detailed description of the preferred embodiments of the invention when taken in conjunction with the accompanying drawings, in which.

Figure 1:
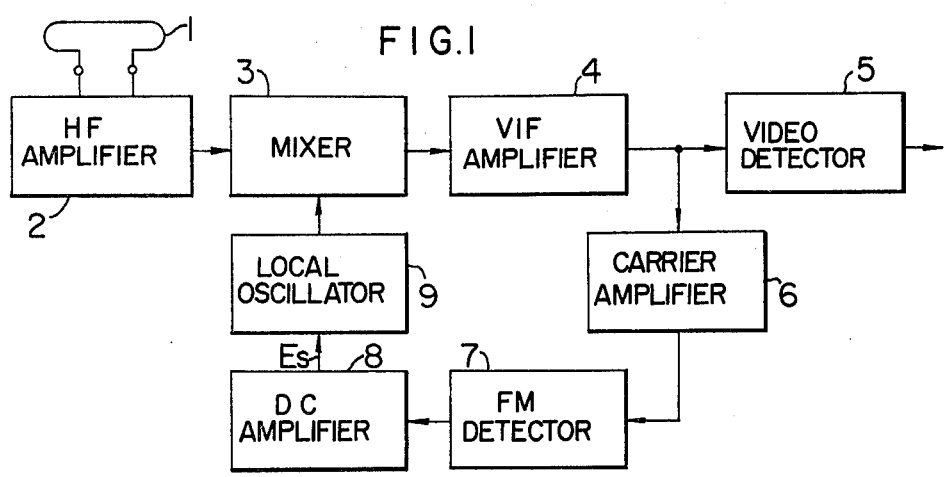
FIG. 1 shows a basic block diagram of an AFC apparatus for a television receiver in accordance with prior art apparatus and the present apparatus.

Referring to FIG. 1, there is shown a basic block diagram of an AFC apparatus for a television receiver, in which numeral 1 denotes an antenna for receiving a television broadcasting signal, 2 denotes a high frequency amplifier circuit for amplifying the received signal, 3 denotes a mixer circuit for mixing the received signal with a local oscillation signal to produce a video intermediate frequency (VIF) signal, 4 denotes a video intermediate frequency amplifier circuit for amplifying the video intermediate frequency signal, 5 denotes a video detector circuit, 6 denotes a carrier amplifier tuned to a video carrier frequency of 58.75 MHz for amplifying the VIF signal, 7 denotes an FM detector for FM detecting the VIF signal to produce an AFC voltage having an S-characteristic in accordance with a deviation of frequency, 8 denotes a D.C. amplifier circuit for amplifying the AFC voltage, and 9 denotes a local oscillator circuit for applying a local oscillation signal to the mixer circuit 3.

Figure 3:
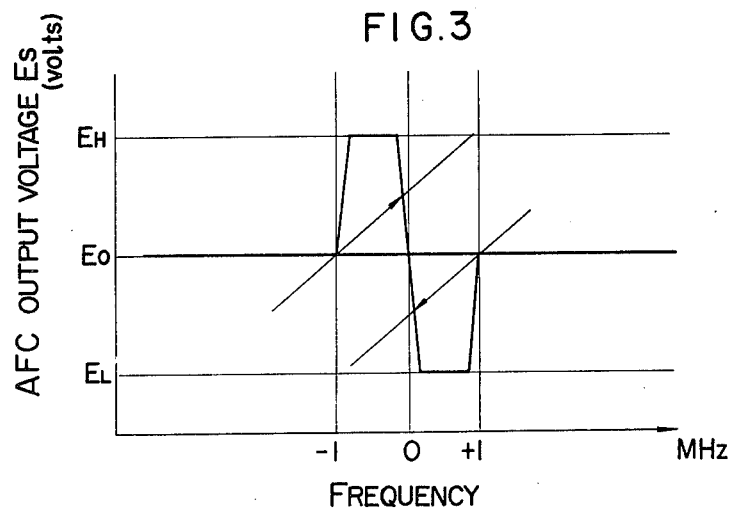
FIG. 3 shows a characteristic chart of the apparatus of FIG. 1.

In FIG. 1, a signal received by the antenna 1 is amplified by the high frequency amplifier circuit 2 and an output therefrom is mixed with the local oscillation signal to produce the video intermediate frequency (VIF) signal, which is amplified by the video intermediate frequency amplifier circuit 4 and an output thereof is converted into a video signal (0–4.5 MHz) in the detector circuit 5. On the other hand, the VIF signal from the video intermediate frequency amplifier circuit 4 is amplified by the carrier amplifier 6 which is tuned to 58.75 MHz and an output thereof is frequency detected by the FM detector 7 which may be a well-known ratio detector, and an output thereof is applied to the D.C. amplifier, which produces an AFC voltage output having an inverted S-characteristic as shown in FIG. 3.

The oscillation frequency of the local oscillator circuit 9 is automatically controlled by the AFC voltage output of the inverted S-characteristic by a feedback action which always maintains the frequency of the video intermediate frequency signal from the mixer circuit 3 at 58.75 MHz even if the signal frequency from the antenna 1 deviates or the frequency of the local oscillator circuit 9 deviates. In this manner, a clear picture can always be displayed on a CRT.

Figure 2:
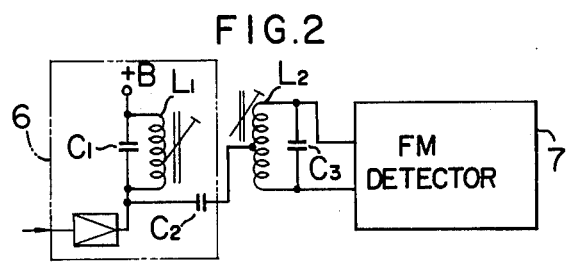
FIG. 2 shows a circuit diagram of the essential part of the prior art apparatus.

FIG. 2 shows a specific circuit diagram of a portion of a prior art apparatus as shown in FIG. 1, in which $L_1$ and $C_1$ denote loads to the carrier amplifier 6 tuned to 58.75 MHz, $L_2$ and $C_3$ function to convert a change in frequency into a change in phase, and are tuned to 58.75 MHz and an output therefrom is applied to the FM detector 7. $C_2$ denotes a coupling capacitor. The illustrated prior art apparatus has a drawback in that the width of the output voltage $E_s$ (inverted S-characteristic voltage) of the AFC is narrow and hence the pull-in range is narrow, i.e. $\pm 1$ MHz, as shown in FIG. 3. As a result, if the local oscillation frequency of the tuner deviates over $\pm 1$ MHz by a change of temperature or voltage or by ageing, the automatic frequency control circuit no longer operates and a color image will not be displayed.

Figure 4:
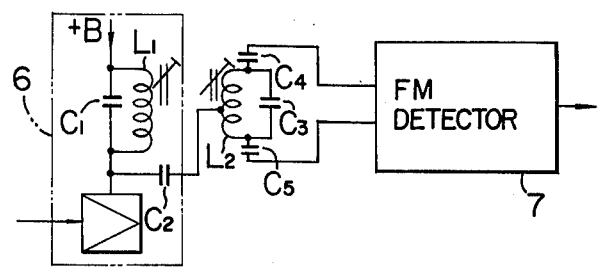
FIG. 4 shows a circuit diagram of the essential part of the AFC apparatus for the television receiver in accordance with one embodiment of the present invention.
Figure 5:
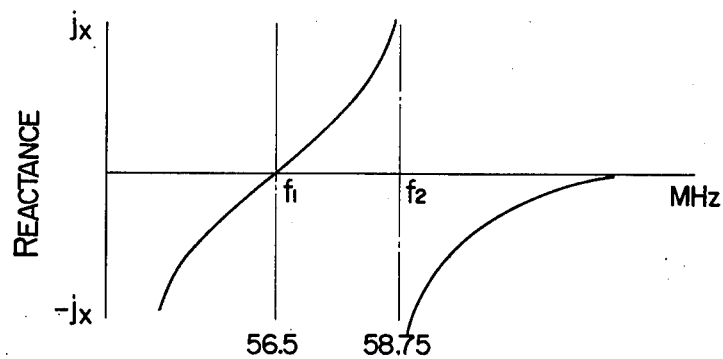
FIGS. 5, 6 and 7 show characteristic charts of the apparatus of FIG. 4.
Figure 6:
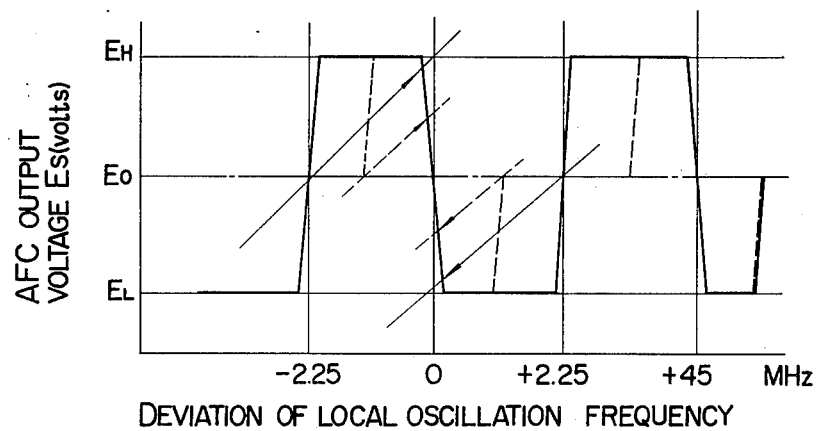
Figure 7:
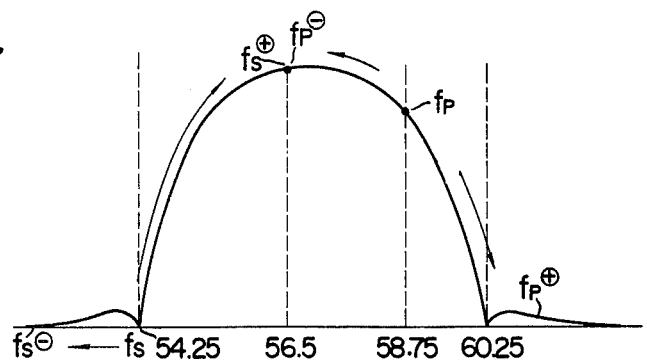

FIG. 4 shows one embodiment of the present invention. Those portions which are not shown in FIG. 4 are similar to those shown in FIG. 1. Further, like reference numerals show like parts to those shown in FIGS. 1 and 2. FIGS. 5 to 7 show characteristic charts for explaining the operation of the present apparatus. As shown in FIG. 4, the feature of the present invention resides in the use of a serial-parallel resonance circuit in the circuit for converting the change in frequency to a change in phase. In FIG. 4, $L_1$ and $C_1$ denote a load to the carrier amplifier 6 tuned to 58.75 MHz, $C_2$ denotes a coupling capacitor, $C_4$, $C_5$, $L_2$ and $C_3$ denote a serial-parallel resonance circuit for converting the change in frequency to a change in phase, and an output of the serial-parallel resonance circuit is applied to the FM detector 7. $L_2$ and $C_3$ are connected in parallel and the capacitors $C_4$ and $C_5$ are connected in series with the parallel circuit at opposite ends thereof. The capacitors $C_4$ and $C_5$ have the same capacitance. The serial-parallel resonance circuit is designed to have a serial resonance frequency $f_1$ of 56.5 MHz and a parallel resonance frequency $f_2$ of 58.75 MHz, as shown in FIG. 5. That is, the parallel resonance frequency $f_2$ is selected to be near the picture carrier frequency while the serial resonance frequency $f_1$ is selected to be near the frequency (56.5 MHz) which is equal to the picture carrier frequency less one half (2.25 Mhz) of the differential frequency (4.5 MHz) between the picture carrier frequency (58.75 MHz) and the sound carrier frequency (54.25 MHz).

Where a phase inverter is provided in the D.C. amplifier 8, the frequency relationship between the parallel resonance frequency $f_2$ and the serial resonance frequency $f_1$ may be reversed.

Referring to FIG. 5 again, the changes in phase relative to the change in frequency near the frequencies $f_1$ and $f_2$ are quite opposite to each other, and the changes in the detected voltage output of the AFC by the FM detector 7 are also opposite. Thus, the AFC output voltage $E_s$ in accordance with the present invention depicts a curve as shown by a solid line in FIG. 6. A dotted line shows an AFC characteristic of the prior art apparatus. If the local oscillation frequency is shifted by +4.5 MHz toward a higher frequency, the associated sound carrier frequency of the selected channel is shifted to 54.25+4.5=58.75 MHz, at which the same AFC voltage output as that of the inverted S-characteristic which is generated near the point where the local oscillation frequency shift is zero is generated. Accordingly, the pull-in range in the present invention is broadened to ±2.25 MHz in comparison with ±1 MHz in the prior art apparatus, that is, broadened to more than double the prior art pull-in range.

The reason why the circuit of the present invention can attain the characteristic shown in FIG. 6 will now be explained. Near the point where the local oscillation frequency shift is 0 MHz, the $f_p$ (picture carrier frequency) is equal to 58.75 MHz in the frequency characteristic of the video intermediate frequency amplifier circuit 4 shown in FIG. 7. Accordingly, the $f_s$ (sound carrier frequency) is beyond the VIF band. Thus, in this case, if the frequency of the VIF signal shifts, the picture carrier signal is caused to have a phase change by the parallel resonance of $C_4$, $C_5$, $L_1$ and $C_3$ so that an AFC voltage having the inverted S-characteristic which falls from left to right like in the prior art AFC is produced. One the other hand, if the local oscillation frequency deviates by −2.25 MHz toward a lower frequency, the $f_p$ becomes 56.5 MHz as shown in FIG. 7 and the $f_s$ is again beyond the VIF band. In this case, the picture carrier signal is caused to have a phase change by the serial resonance of $C_4$, $C_5$, $L_1$ and $C_3$ so that an AFC voltage falling from right to left which is opposite to the inverted S-characteristic obtained when the $f_p$ is near 58.75 MHz is produced. On the other hand, if the local oscillation frequency deviates by approximately +2.25 MHz toward the higher frequency, the $f_s$ becomes 56.5 MHz as shown in FIG. 7 and the $f_p$ becomes 60.25 MHz which is beyond the VIF band. In this case, the sound carrier is caused to have a phase change by the serial resonance of $C_4$, $C_5$, $L_1$ and $C_3$ so that an AFC voltage falling from right to left as in the case where the local oscillation frequency shifts by −2.25 MHz toward lower frequency is produced. Further, if the local oscillation frequency deviates by +4.5 MHz toward a higher frequency, the $f_s$ becomes 58.75 MHz and the $f_p$ is beyond the VIF band so that an AFC voltage falling from left to right like in the case where the shift of the local oscillation frequency is 0 MHz is produced. In this way, where the deviation of the local oscillation frequency is near −2.5 MHz and +2.25 MHz, the AFC voltage falling from right to left is produced, and where the deviation of the local oscillation frequency is near 0 MHz and +4.5 MHz, an AFC voltage falling from left to right is produced as an output voltage of the AFC. Since there is continuity between each adjacent ones of those points, a high voltage $E_H$ is produced between −2.25 MHz and 0 MHz, a low voltage $E_L$ is produced between 0 MHz and +2.25 MHz, the high voltage $E_H$ is produced between +2.25 MHz and +4.5 MHz, the low voltage $E_L$ is produced above +4.5 MHz and the low voltage $E_L$ is produced below −2.25 MHz. In this way, the characteristic shown by the solid line in FIG. 6 is obtained. This characteristic provides the pull-in range and hold range which are more than twice as wide as those obtained in the prior art AFC, and assures a more stable AFC operation and enables absorbtion of a drift of the local oscillation frequency of the tuner to allow the display of an optimum picture image.

As described hereinabove, according to the present invention, the pull-in range and hold range can be broadened by constructing the phase shifter which converts the change in frequency of the output of the video intermediate frequency amplifier circuit into a change in phase for application to the FM detector, by the serial-parallel resonance circuit.

Figure 8:
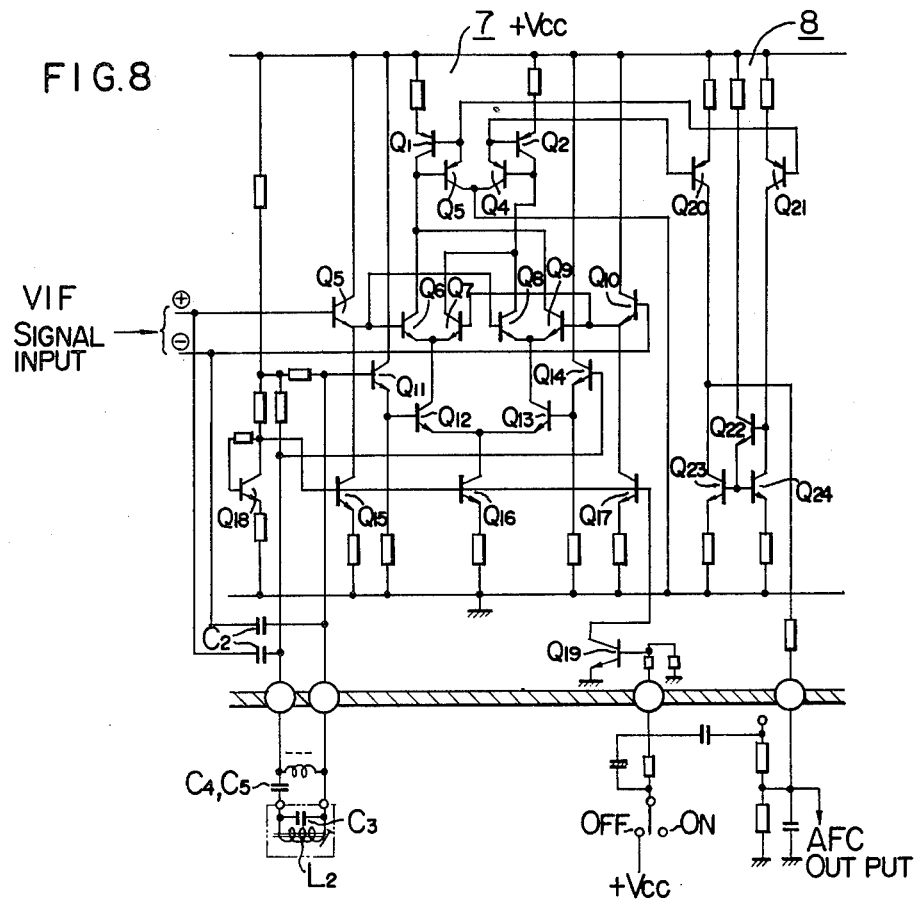
FIG. 8 shows a circuit diagram of the essential part of the AFC apparatus for the television receiver in accordance with another embodiment of the present invention.

FIG. 8 shows an embodiment of the present apparatus which is implemented by an integrated circuit structure. In the present embodiment, the FM detector 7 comprises a synchronous detector including a differential amplifier composed of transistor $Q_1$ to $Q_{19}$, and the D.C. amplifier 8 is composed of transistors $Q_{20}$ to $Q_{24}$. VIF signals of opposite polarities (with an amplitude being limited to a selected magnitude) are applied to the transistors $Q_5$ and $Q_{10}$, and the change in frequency is converted to a change in phase by the phase shifter including the serial-parallel resonance circuit composed of the coil $L_2$ and the capacitors $C_3$, $C_4$ and $C_5$, for application to the bases of the transistors $Q_{11}$ and $Q_{14}$, respectively. As a result, detected outputs are produced at the collectors of the transistors $Q_3$ and $Q_4$ in accordance with the frequency deviation of the VIF signal and an AFC voltage is taken out of the junction of the collectors of the transistors $Q_{20}$ and $Q_{23}$.

It should be understood that the FM detector 7 may be any FM detector other than the ratio detector and synchronous detector described above.

What is claimed is:

1. An automatic frequency control apparatus for a television receiver comprising a mixer circuit for mixing a received television signal with a local oscillation frequency signal to produce an intermediate frequency signal, a local oscillator circuit for applying said local oscillation frequency signal to said mixer circuit, a video intermediate frequency amplifier circuit for amplifying said intermediate frequency signal output of said mixer circuit, an FM detector for FM detecting the output of said video intermediate frequency amplifier circuit, a feedback loop for applying the output voltage of said FM detector having an S-characteristic to said local oscillator circuit to automatically control the oscillation frequency of said local oscillator circuit and a phase shifter for converting a change in the output frequency of said video intermediate frequency amplifier circuit into a change in phase and to apply the phase change to said FM detector, said phase shifter comprising a serial-parallel resonance circuit with one of the serial resonance frequency and the parallel resonance frequency thereof being selected at a frequency near a picture carrier frequency while the other being selected near a frequency equal to the picture carrier frequency less one half of a differential frequency between the picture carrier frequency and a sound carrier frequency.

2. An automatic frequency control apparatus for a television receiver according to claim 1, wherein said serial-parallel resonance circuit comprises a capacitor and a coil which are connected in parallel and capacitors connected in series with the parallel circuit.

* * * * *